US012256653B2

(12) United States Patent
Li et al.

(10) Patent No.: US 12,256,653 B2
(45) Date of Patent: Mar. 18, 2025

(54) PCM CELL WITH NANOHEATER SURROUNDED WITH AIRGAPS

(71) Applicant: INTERNATIONAL BUSINESS MACHINES CORPORATION, Armonk, NY (US)

(72) Inventors: Juntao Li, Cohoes, NY (US); Kangguo Cheng, Schenectady, NY (US); Dexin Kong, Redmond, WA (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 585 days.

(21) Appl. No.: 17/643,416

(22) Filed: Dec. 9, 2021

(65) Prior Publication Data
US 2023/0189672 A1 Jun. 15, 2023

(51) Int. Cl.
*H10N 70/00* (2023.01)
*H10N 70/20* (2023.01)

(52) U.S. Cl.
CPC ....... *H10N 70/8413* (2023.02); *H10N 70/011* (2023.02); *H10N 70/231* (2023.02); *H10N 70/826* (2023.02); *H10N 70/8822* (2023.02); *H10N 70/8825* (2023.02); *H10N 70/8828* (2023.02)

(58) Field of Classification Search
None
See application file for complete search history.

(56) References Cited

U.S. PATENT DOCUMENTS

| 6,815,704 B1 | 11/2004 | Chen |
| 6,972,430 B2 | 12/2005 | Casagrande |
| 7,238,959 B2 | 7/2007 | Chen |
| 7,964,862 B2 | 6/2011 | Chen |
| 7,977,662 B2 | 7/2011 | Ryoo |
| 8,063,393 B2 | 11/2011 | Chen |
| 8,106,376 B2 | 1/2012 | Lai |
| 8,288,752 B2 | 10/2012 | Park |
| 8,305,800 B2 | 11/2012 | Tu |
| 8,525,143 B2 | 9/2013 | Ward |
| 9,548,110 B2 | 1/2017 | Athmanathan |
| 10,818,838 B1* | 10/2020 | Leobandung ........ H10N 70/231 |

(Continued)

FOREIGN PATENT DOCUMENTS

WO 2007030483 A2 3/2007

OTHER PUBLICATIONS

Wang et al., "Application of phase-change materials in memory taxonomy", Science and Technology of Advanced Materials, 2017, vol. 18, No. 1, 406-429.

*Primary Examiner* — Asok K Sarkar
(74) *Attorney, Agent, or Firm* — Jeffrey Ingalls (57) ABSTRACT

A phase change memory (PCM) device is provided. The PCM device includes a bottom electrode formed on a substrate, a heater electrode formed on the bottom electrode, the heater electrode having a tapered portion that becomes narrower in a direction away from the substrate. The PCM device also includes an interlayer dielectric (ILD) layer formed on the tapered portion of the heater electrode, the interlayer layer dielectric including an airgap that at least partially surrounds the tapered portion of the heater electrode. The PCM device also includes a phase change layer formed on the heater electrode, and a top electrode formed on the phase change layer.

20 Claims, 9 Drawing Sheets

(56) References Cited

U.S. PATENT DOCUMENTS

| | | | |
|---|---|---|---|
| 2007/0158633 A1* | 7/2007 | Lai | H10N 70/231 257/E29.17 |
| 2010/0320435 A1 | 12/2010 | Tu | |
| 2013/0015421 A1* | 1/2013 | Sim | H10N 70/8828 257/E47.001 |
| 2013/0240820 A1* | 9/2013 | Shin | H10N 70/8413 257/3 |
| 2014/0319445 A1* | 10/2014 | Cho | H10N 70/8828 257/4 |
| 2021/0050220 A1* | 2/2021 | Chen | H01L 21/31053 |
| 2022/0393101 A1* | 12/2022 | Lee | H10N 50/01 |

\* cited by examiner

PCM CELL WITH NANOHEATER SURROUNDED WITH AIRGAPS

BACKGROUND

The present disclosure generally relates to fabrication methods and resulting structures for semiconductor based electronic devices. More specifically, the present disclosure relates to a phase-change memory (PCM) device and method of manufacturing a PCM device.

Phase-change memory (PCM) structures are a type of memory device that is considered for analog computing. PCM is an emerging non-volatile (NV) random-access (RAM) which offers some advantage over existing non-volatile memories (NVMs). It has potentials for both classic memory applications and neuromorphic computing.

In a PCM, a phase change material is formed between two electrodes and the resistance can change via a phase change and this change in resistance is reversible. The PCM is heated for a relatively short time and quickly cooled to become an amorphous state, which achieves high resistance. The PCM is heated at a lower temperature but for a relatively longer time to become a crystalline state, which achieves low resistance.

One of the considerations for PCM devices is their programming current, which can be very large during the power-intensive reset step. Heat loss, heating efficiency, and the reset current may be topics of interest affecting the performance of PCM devices.

SUMMARY

Embodiments of the present disclosure relate to a phase change memory (PCM) device is provided. The PCM device includes a bottom electrode formed on a substrate, a heater electrode formed on the bottom electrode, the heater electrode having a tapered portion that becomes narrower in a direction away from the substrate. The PCM device also includes an interlayer dielectric (ILD) layer formed on the tapered portion of the heater electrode, the interlayer dielectric including an airgap that at least partially surrounds the tapered portion of the heater electrode. The PCM device also includes a phase change layer formed on the heater electrode, and a top electrode formed on the phase change layer.

Embodiments of the present disclosure relate to a method of manufacturing a phase change memory (PCM) device. The method includes: forming a bottom electrode on a substrate; forming a heater electrode on the bottom electrode, the heater electrode having a tapered portion that becomes narrower in a direction away from the substrate; forming an interlayer dielectric (ILD) layer on the tapered portion of the heater electrode, the interlayer layer dielectric including an airgap that at least partially surrounds the tapered portion of the heater electrode; forming a phase change layer on the heater electrode; and forming a top electrode on the phase change layer.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, explain the principles of the disclosure. The drawings are only illustrative of certain embodiments and do not limit the disclosure.

DETAILED DESCRIPTION

The present disclosure generally relates to fabrication methods and resulting structures for semiconductor-based electronic devices. In particular, the present disclosure relates to phase change memory (PCM) devices and PCM memory cells, and methods of manufacturing same. A PCM device has its conductance change gradually during the SET operation and is abrupt during the RESET operation. This present embodiments provides a method and structure for forming PCM cells with a nanoscale TiN heater. Air gaps surrounding the TiN heater may prevent or reduce thermal dissipation, and the air gaps may enable high efficiency heating during the SET/RESET operation, and thus leading to a lower SET/RESET current.

The flowcharts and cross-sectional diagrams in the Figures illustrate methods of manufacturing the hybrid memory cells according to various embodiments. In some alternative implementations, the manufacturing steps may occur in a different order than that which is noted in the Figures, and certain additional manufacturing steps may be implemented between the steps noted in the Figures. Moreover, any of the layered structures depicted in the Figures may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, phase-change memory (also known as PCM, PCME, PRAM, PCRAM, OUM (ovonic unified memory) and C-RAM or CRAM (chalcogenide RAM)) is a type of non-volatile random-access memory. PMCs exploit the unique behavior of chalcogenide glass. Phase change materials, such as chalcogenides, can be caused to change phase between an amorphous state and a crystalline state by application of electrical current at levels suitable for implementation in integrated circuits. The generally amorphous state is characterized by higher resistivity than the generally crystalline state, which can be readily sensed to indicate data.

Phase change materials in PCM devices are capable of being switched between a first structural state in which the material is in a generally amorphous solid phase, and a second structural state in which the material is in a generally crystalline solid phase in the active region of the cell. The term "amorphous" is used to refer to a relatively less ordered structure, more disordered than a single crystal, which has the detectable characteristics such as higher electrical resistivity than the crystalline phase. The term "crystalline" is used to refer to a relatively more ordered structure, more ordered than in an amorphous structure, which has detectable characteristics such as lower electrical resistivity than the amorphous phase. Other material characteristics affected by the change between amorphous and crystalline phases include atomic order, free electron density and activation energy. The material can be switched into either different solid phases or mixtures of two or more solid phases, providing a gray scale between completely amorphous and completely crystalline states.

The change from the amorphous to the crystalline state in PCM devices is generally a lower current operation, requiring a current that is sufficient to raise the phase change material to a level between a phase transition temperature and a melting temperature. The change from crystalline to amorphous, referred to as "reset," is generally a higher current operation, which includes a short high current density pulse to melt or break down the crystalline structure, after which the phase change material cools quickly, quenching the phase change process, thus allowing at least a portion of the phase change structure to stabilize in the amorphous state. It is desirable to minimize the magnitude of the reset current used to cause transition of phase change material from a crystalline state to an amorphous state. The magnitude of the needed reset current can be reduced by reducing the volume of the active region in the phase change material element in the cell.

Embodiments in accordance with the present disclosure provide methods and devices for employing a PCM based memory device with airgaps surrounding the nanoscale heating element. Air gaps surrounding the TiN heater prevent thermal dissipation enable high efficiency heating during the SET/RESET operation, and thus lower SET/RESET current.

Figure 1:
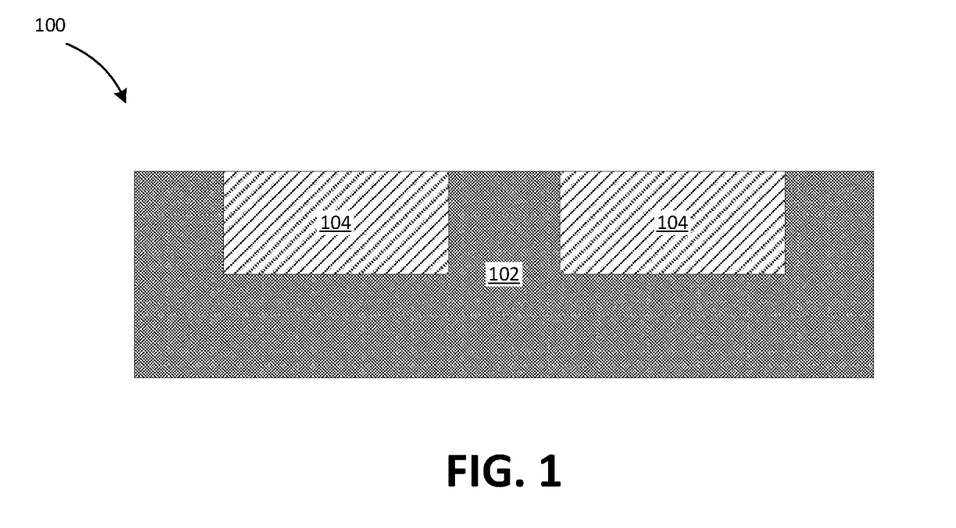
FIG. 1 is a cross-sectional view of a PCM memory cell semiconductor device at an intermediate stage of the manufacturing process, according to embodiments.

Referring now to the drawings in which like numerals represent the same or similar elements and initially to FIG. 1, an exemplary method of manufacturing a PCM memory cell 100 to which the present embodiments may be applied is shown. As shown in FIG. 1, an underlayer 102 is formed over a base semiconductor substrate (not shown). There may be any suitable number of intermediate layers between the substrate and the underlayer 102, and in FIG. 1 the underlayer 102 is shown as the bottom layer for the sake of simplicity and ease of illustration. The underlayer 102 may be an interlayer dielectric (ILD) layer composed of, for example, $SiO_2$. However, it should be appreciated that any other suitable dielectric material or combination of materials may be used for the underlayer 102. In certain embodiments, the semiconductor substrate includes a semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), II-V compound semiconductor or another like semiconductor. In addition, multiple layers of the semiconductor materials can be used as the semiconductor material of the substrate. The semiconductor substrate can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide or nitride layer. In certain examples, the underlayer 102 is a MgO substrate. The underlayer 102 may be a silicon substrate with layers of connections and structures, such as, for example, transistors and isolations built on it.

As shown in FIG. 1, bottom electrodes 104 are patterned and formed into the underlayer 102. The bottom electrodes 104 are parallel metal lines in a dielectric layer, and these serve as word lines or bit lines for the PCM memory cell 100. The bottom electrode can include any suitable material in accordance with the embodiments described herein. Examples of suitable materials that can be included in the bottom electrode 104 include, but are not limited to, copper, titanium-based materials (e.g., titanium nitride materials (e.g., TiN)), tantalum-based materials (e.g., tantalum nitride materials (e.g., TaN)), and tungsten-based materials (e.g., W).

Figure 2:
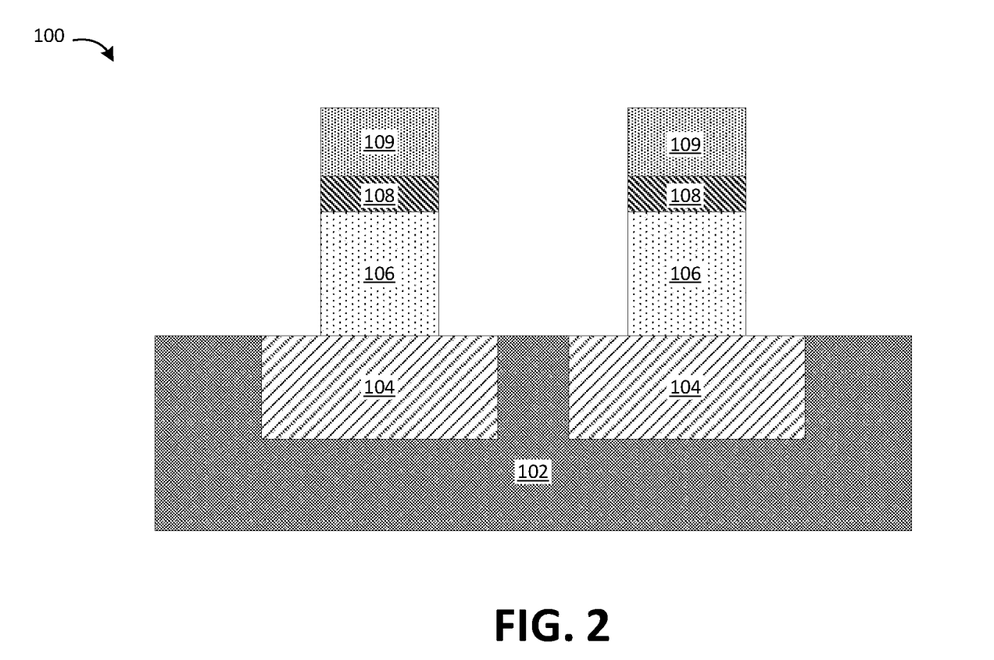
FIG. 2 is a cross-sectional view of the semiconductor device of FIG. 1 after additional fabrication operations, according to embodiments.

Referring now to FIG. 2, this figure is a cross-sectional view of the semiconductor device of FIG. 1 after additional fabrication operations, according to embodiments. As shown in FIG. 2, bottom heater pillars are formed that include a heater 106 (also referred to as a nanoheater), a dielectric cap layer 108 and a hardmask 109. Initially, the heater 106 and dielectric cap layer 108 may be formed as a uniform layer. Then, the hardmask 109 may be patterned, and any suitable material removal process (e.g., reactive ion etching or RIE) may be used to form the heater pillar structures shown in FIG. 2. Some examples of heater materials can include, but not limited to, titanium nitride (TiN), silicon carbide (SiC), graphite, tantalum nitride (TaN), tungsten nitride (WN), titanium tungsten (TiW), or titanium aluminide (TiAl) or any other suitable electrically conducting material.

The dielectric cap 108 is formed on top of the heater 106. The hardmask 109 may include at least one material, but is not limited to, materials that can be selectively removed. In certain examples, the mask can include soft and/or hardmask materials and can be formed using deposition, photolithography and etching. In one embodiment, the mask can be a hardmask. For example, the mask can include a nitride-containing material, such as, e.g., a silicon nitride material (e.g., SiN, a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof). However, the hardmask 109 can include any suitable dielectric material that can be deposited by, e.g., chemical vapor deposition (CVD) and related methods. Other compositions for the mask include, but are not limited to, silicon oxides, silicon carbides, etc. Spin-on dielectrics that can be utilized as a material for the mask can include, but are not limited to: silsequioxanes, siloxanes, and boron phosphate silicate glass (BPSG).

The heater 106 and the dielectric cap layer 108 may be formed as a dot (in plan view) or as any other suitable shape or cross-section (e.g, square, rectangular or elliptical). It should be appreciated that the heater 106 and the dielectric cap layer 108 may be formed through any suitable combination of material deposition, patterning and material removal processes known to one skilled in the art and as generally described above.

Figure 3:
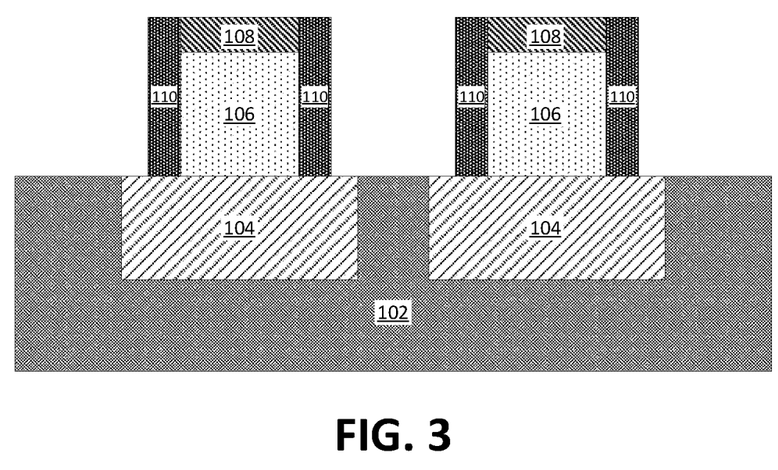
FIG. 3 is a cross-sectional view of the semiconductor device of FIG. 2 after additional fabrication operations, according to embodiments.

Referring now to FIG. 3, this figure is a cross-sectional view of the PCM memory cell 100 of FIG. 2 after additional fabrication operations, according to embodiments. As shown in FIG. 3, a sidewall spacer layer 110 (or sidewall spacer) is formed on sidewalls of the heater 106 and the dielectric cap layer 108. The sidewall spacer layer 110 may include at least one material, but is not limited to, insulator materials such as silicon nitride (SixNy), silicon oxynitride (SiON), and/or silicon carbon nitride (SiCN), and/or oxide materials such as silicon oxide (SiOx). In other examples, the sidewall spacer layer 110 can include any suitable dielectric material in accordance with the embodiments described herein. In one embodiment, the sidewall spacer layer can include a low-k dielectric material. Examples of suitable dielectric materials for the spacer include, but are not limited to, oxides, nitrides and/or oxynitrides. In one example method of forming the sidewall spacer layer 110 it may be formed by blanket (conformal) deposition, followed by removal of horizontal portions thereof (i.e., everything but the vertical portions covering the sidewalls). It should be appreciated that the sidewall spacer layer 110 may be formed through any suitable combination of material deposition, patterning and material removal processes known to one skilled in the art and as generally described above.

Figure 4:
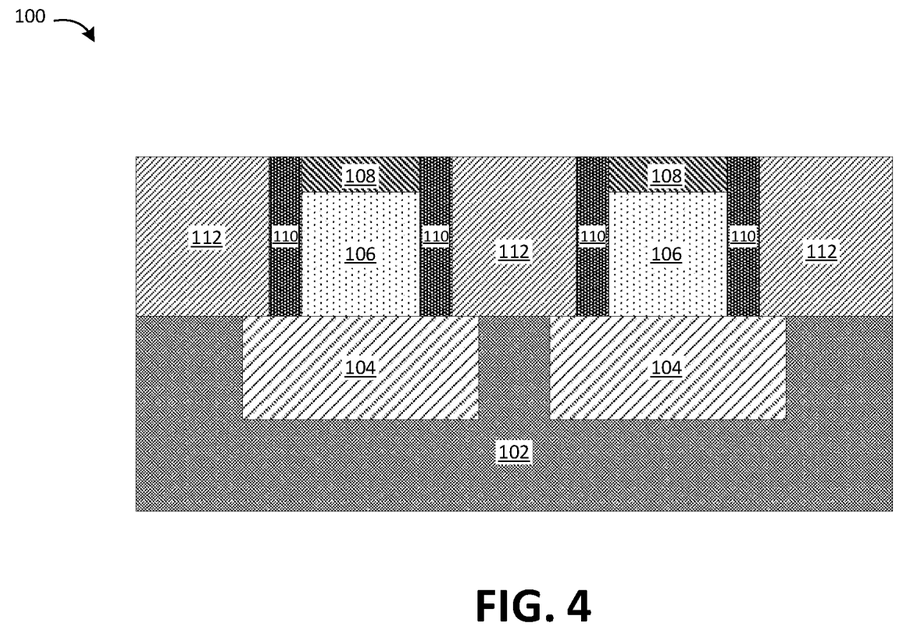
FIG. 4 is a cross-sectional view of the semiconductor device of FIG. 3 after additional fabrication operations, according to embodiments.

Referring now to FIG. 4, this figure is a cross-sectional view of the semiconductor device PCM memory cell 100 of FIG. 3 after additional fabrication operations, according to embodiments. As shown in FIG. 4, an interlayer dielectric (ILD) layer 112 is conformally formed over the entire surface of the PCM memory cell 100. In certain examples, suitable ILD materials include, but are not limited to, oxide low-κ materials such as silicon oxide (SiOx), SiOCH, and/or oxide ultralow-κ interlayer dielectric (ULK-ILD) materials, e.g., having a dielectric constant κ of less than 2.7. By comparison, silicon dioxide (SiO₂) has a dielectric constant κ value of 3.9. Suitable ultralow-κ dielectric materials include, but are not limited to, porous organosilicate glass (pSiCOH). In certain examples, the materials of the ILD layer 112 may include one or more inorganic or organic materials. The ILD layer 112 can include any materials known in the art, such as, for example, porous silicates, carbon doped oxides, silicon dioxides, silicon nitrides, silicon oxynitrides, or other dielectric materials. The ILD can be formed using any method known in the art, such as, for example, chemical vapor deposition, plasma enhanced chemical vapor deposition, atomic layer deposition, or physical vapor deposition. As shown in FIG. 4, in certain examples, after the formation of the ILD layer 112, a CMP process may be performed to planarize the top surface of the PCM memory cell 100, while using the hardmask 108 as a stopping point for the CMP process.

Figure 5:
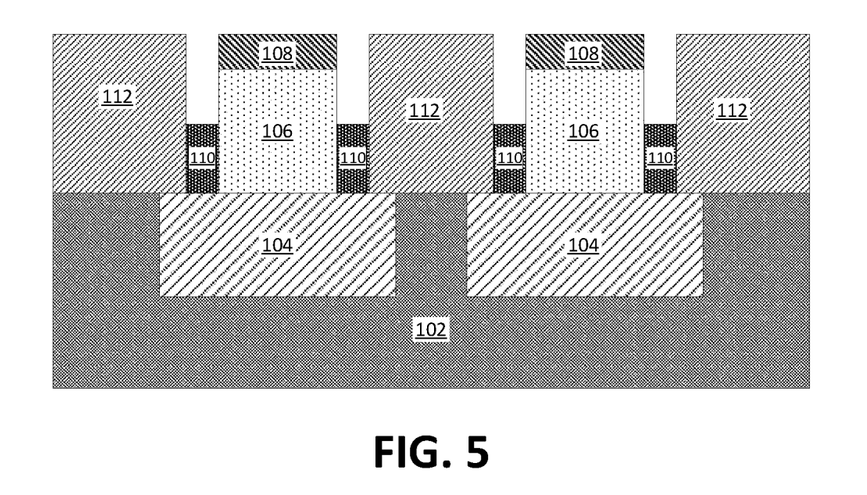
FIG. 5 is a cross-sectional view of the semiconductor device of FIG. 4 after additional fabrication operations, according to embodiments.

Referring now to FIG. 5, this figure is a cross-sectional view of the PCM memory cell 100 of FIG. 4 after additional fabrication operations, according to embodiments. As shown in FIG. 5, an etching process is performed to recess the sidewall spacer layer 110 to a level that is somewhere between the upper surface and lower surface of the heater 106. In other words, a height of the sidewall spacer layer 110 is less than a height of the heater 106 electrode. Any suitable etch process can be used to perform the sidewall spacer layer 110 etch in accordance with the embodiments described herein. The etch process should be selective to the ILD layer 112 and the hardmask 108 (e.g., the dielectric cap) and the heater 106 (i.e., the heater electrode). The sidewall spacer layer 110 can also be silicon oxide, which can be removed using an etching process such as wet etching (e.g., an aqueous solution containing hydrofluoric acid), dry etching (e.g., plasma oxide etch), chemical oxide removal, or hydrofluoric vapor, for example, which employs a chemistry that is etch silicon oxide selective to other materials.

Figure 6:
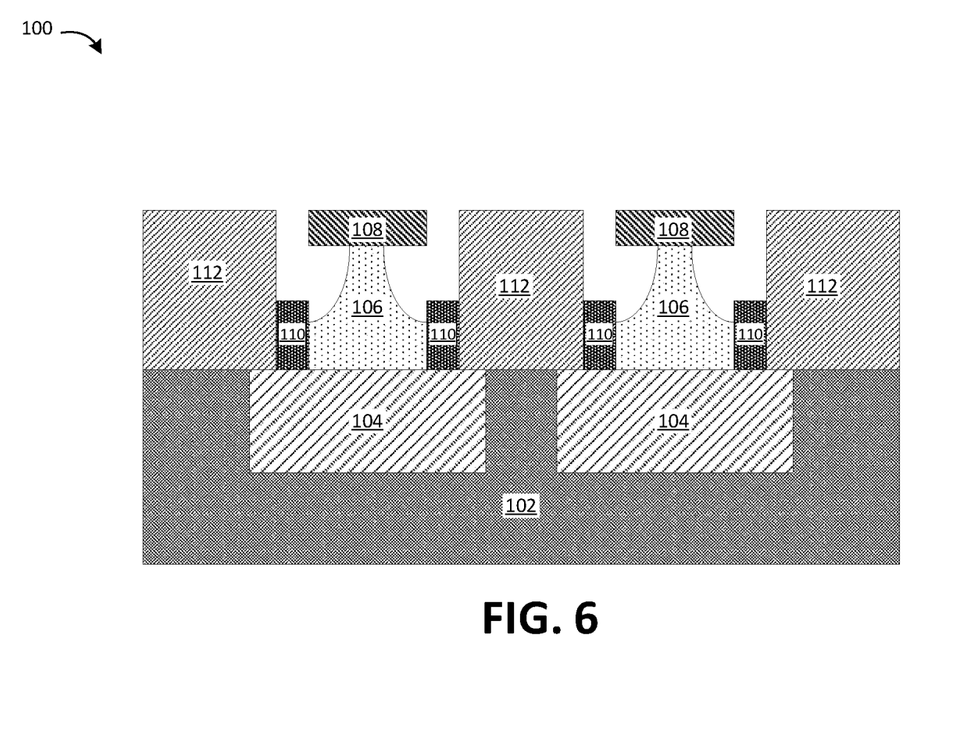
FIG. 6 is a cross-sectional view of the semiconductor device of FIG. 5 after additional fabrication operations, according to embodiments.

Referring now to FIG. 6, this figure is a cross-sectional view of the PCM memory cell 100 of FIG. 5 after additional fabrication operations, according to embodiments. As shown in FIG. 6, an isotropic etching of the heater 106 layer (e.g., a TiN pillar). The heater 106 (or heater electrode) can be etched to form a tapered (for example, conical, pyramidic, asymptotic, etc.) shaped tip using, e.g., an isotropic etch process. The term "isotropic etch" denotes an etch process that is non-directional. By "non-directional" it is meant that the etch rate is not substantially greater in any one direction in comparison to all of the etch directions. The isotropic etch may be a wet chemical etch or a dry etch. For example, the etchant may be a corrosive liquid or a chemically active ionized gas, such as a plasma. Thus, after the etching process is performed on the heater 106, the heater is recessed inward through at least a part of the thickness of the heater 106, and the remaining portions of the sidewall spacer layer 110 still cover the vertical sidewall portions of the heater 106 that are not affected by the etch. The profile of the etched portions of the heater 106 may have a curved or slanted profile shape (e.g., as shown in FIG. 6). Moreover, as shown in FIG. 6, the hardmask 108 (or top dielectric cap layer) remains in place as the etching is performed before so little material remains of the top of the heater 106 that the hardmask 108 could fall down. Thus, the hardmask 108 allows the heater 106 electrode to be etched to a more tapered form. The more tapered form results in a sharper tip located at the upper center of the bottom electrode to achieve a smaller contact area with the top phase change material (e.g., GST), as discussed in further detail below.

Figure 7:
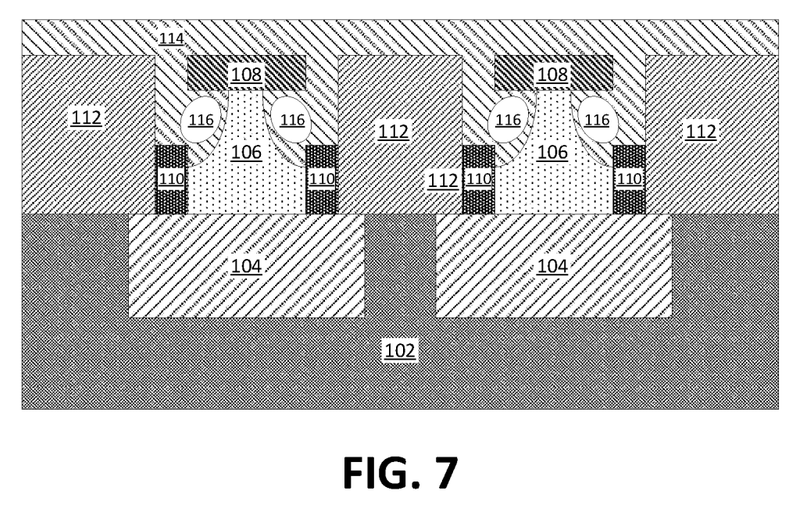
FIG. 7 is a cross-sectional view of the semiconductor device of FIG. 6 after additional fabrication operations, according to embodiments.
Figure 8:
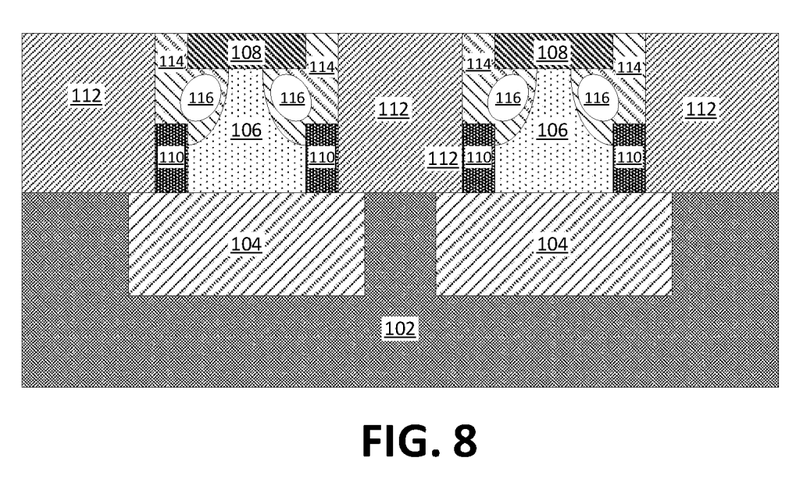
FIG. 8 is a cross-sectional view of the semiconductor device of FIG. 7 after additional fabrication operations, according to embodiments.

Referring now to FIG. 7, this figure is a cross-sectional view of the PCM memory cell 100 of FIG. 6 after additional fabrication operations, according to embodiments. As shown in FIG. 7, a non-conformal dielectric layer 114 is deposited all over the PCM memory cell 100 and in the spaced formed in the previous etching operation between the heater 106, the ILD layer 112, the hardmask 108, and the sidewall spacer layer 110. As shown in FIG. 7, owing to the geometry of the spaces and the nature of the non-conformal dielectric layer 114 deposition, there will be airgaps 116 surrounding (or at least partially surrounding) the heater 106. In other words, during the deposition, eventually the access to the airgaps 116 will be closed off so that even when additional material of the non-conformal dielectric layer 114 is deposited, the airgaps 116 will remain. In other words, the upper portion and lower portion of the void are filled without completely filling a middle portion. Accordingly, a pocket of air is trapped in the dielectric material to form the airgap 116. In some embodiments, the airgap 116 can be formed by depositing multiple dielectric materials such as first depositing a SiN layer followed by depositing a SiOCN layer. Initially, as shown in FIG. 7, an additional thickness of the non-conformal dielectric layer 114 may be deposited above the top surface of the hardmask 108. This additional material may be removed with a CMP process, as shown in FIG. 8, using the hardmask 108 as a stopping point for the CMP process.

Figure 9:
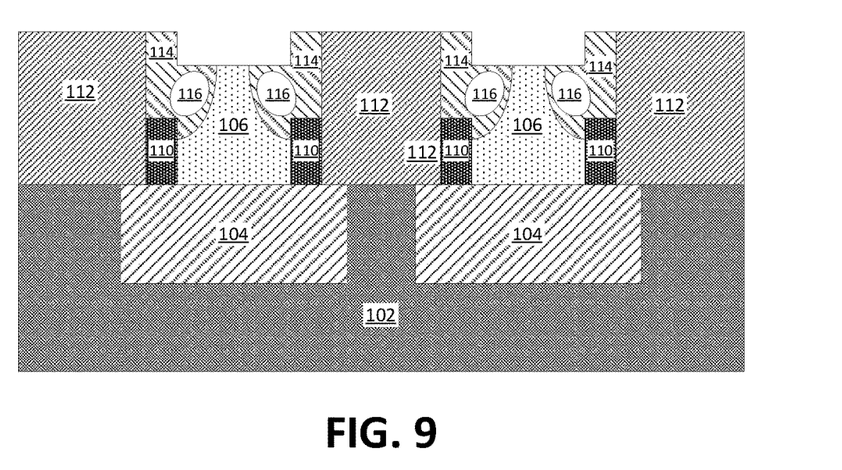
FIG. 9 is a cross-sectional view of the semiconductor device of FIG. 8 after additional fabrication operations, according to embodiments.
Figure 10:
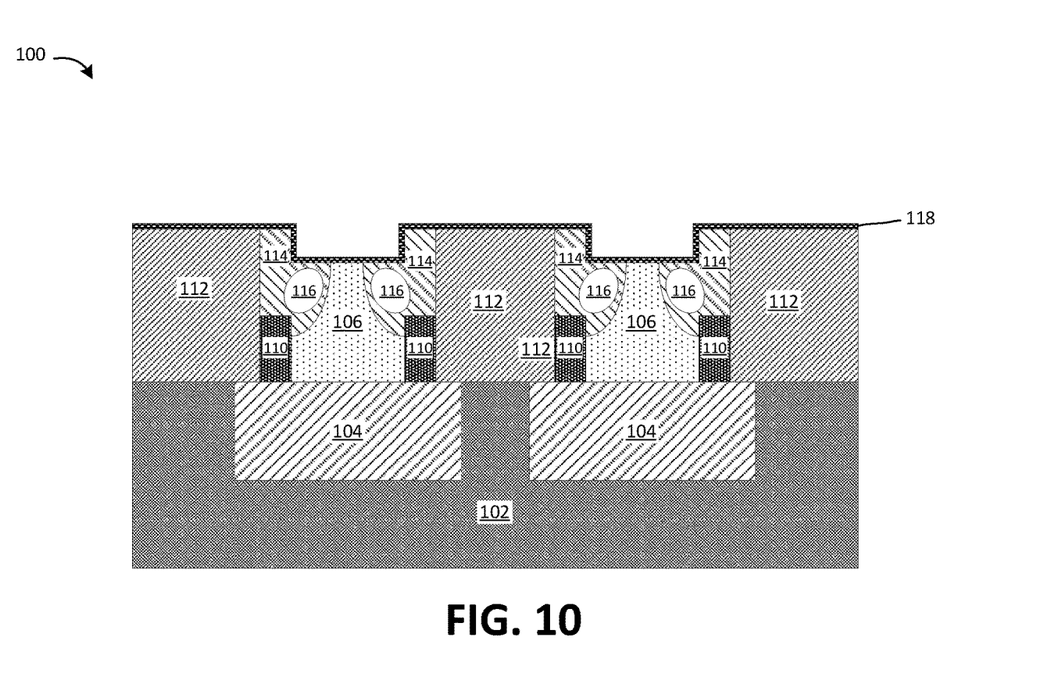
FIG. 10 is a cross-sectional view of the semiconductor device of FIG. 9 after additional fabrication operations, according to embodiments.

Referring now to FIG. 9, this figure is a cross-sectional view of the PCM memory cell 100 of FIG. 8 after additional fabrication operations, according to embodiments. As shown in FIG. 9, the hardmask 108 (e.g., the dielectric cap layer) is removed to expose the tip of the heater 106. Then, as shown in FIG. 10, an etch stop layer 118 (an ILD etch stop layer) is deposited conformally over the entire surface of the PCM memory cell 100. The etch stop layer 118 may be formed of, for example, SiN.

Figure 11:
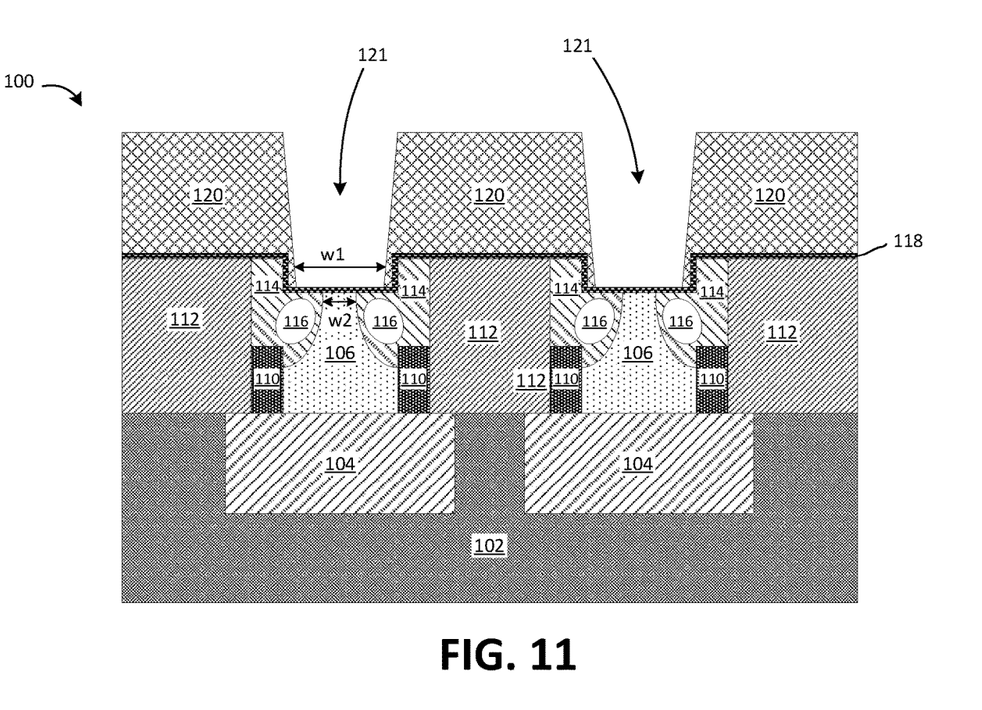
FIG. 11 is a cross-sectional view of the semiconductor device of FIG. 10 after additional fabrication operations, according to embodiments.

Referring now to FIG. 11, this figure is a cross-sectional view of the PCM memory cell 100 of FIG. 10 after additional fabrication operations, according to embodiments. As shown in FIG. 11, a second ILD layer 120 is deposited over the entire surface of the PCM memory cell 100. Suitable ILD materials include, but are not limited to, oxide low-κ materials such as silicon oxide (SiOx), SiOCH, and/or oxide ultralow-κ interlayer dielectric (ULK-ILD) materials, e.g., having a dielectric constant κ of less than 2.7. By comparison, silicon dioxide (SiO₂) has a dielectric constant κ value of 3.9. Suitable ultralow-κ dielectric materials include, but are not limited to, porous organosilicate glass (pSiCOH). A process such as CVD, ALD or PVD can be employed to deposit the second ILD layer 120 around the PCM memory cell 100. Following deposition, the second ILD layer 120 can be planarized using a process such as chemical mechanical polishing (CMP) remove any excess material of the second ILD layer 120 and to planarize the top surface of the PCM memory cell 100. Then, vias 121 are formed (or patterned) into the second ILD layer 120 to make room for the heating element. As shown in FIG. 11, a via width w1 is greater than a tip width w2 of the tip portion of the heater 106.

Figure 12:
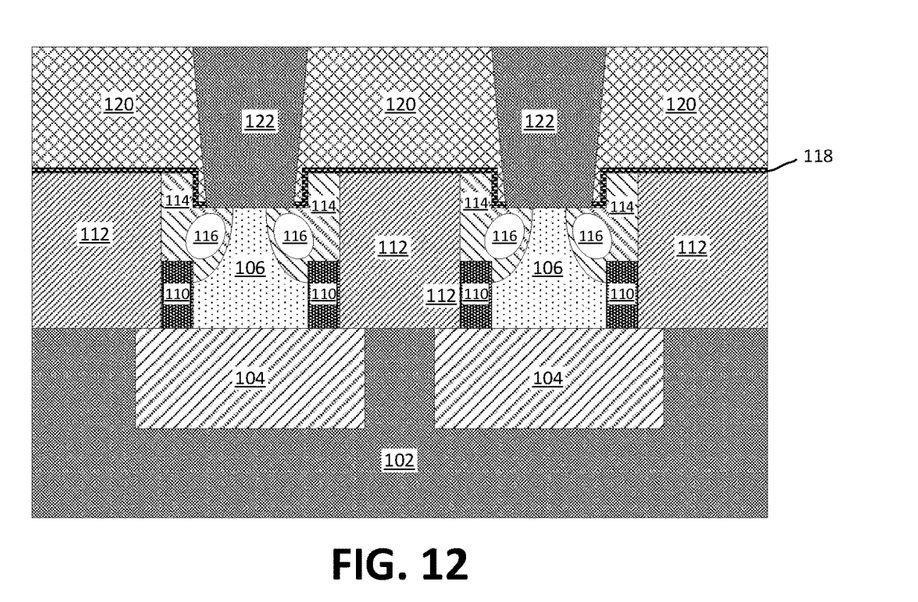
FIG. 12 is a cross-sectional view of the semiconductor device of FIG. 11 after additional fabrication operations, according to embodiments.

Referring now to FIG. 12, this figure is a cross-sectional view of the PCM memory cell 100 of FIG. 11 after additional fabrication operations, according to embodiments. As shown in FIG. 12, an etch stop layer opening is made in the etch stop layer 118 at the bottom of the vias 121, thereby exposing the tip of the heater 106. Then, a phase change layer 122 is formed to fill the vias 121, and the PCM memory cell 100 is once again optionally subjected to a CMP to planarize the top surface thereof.

Figure 13:
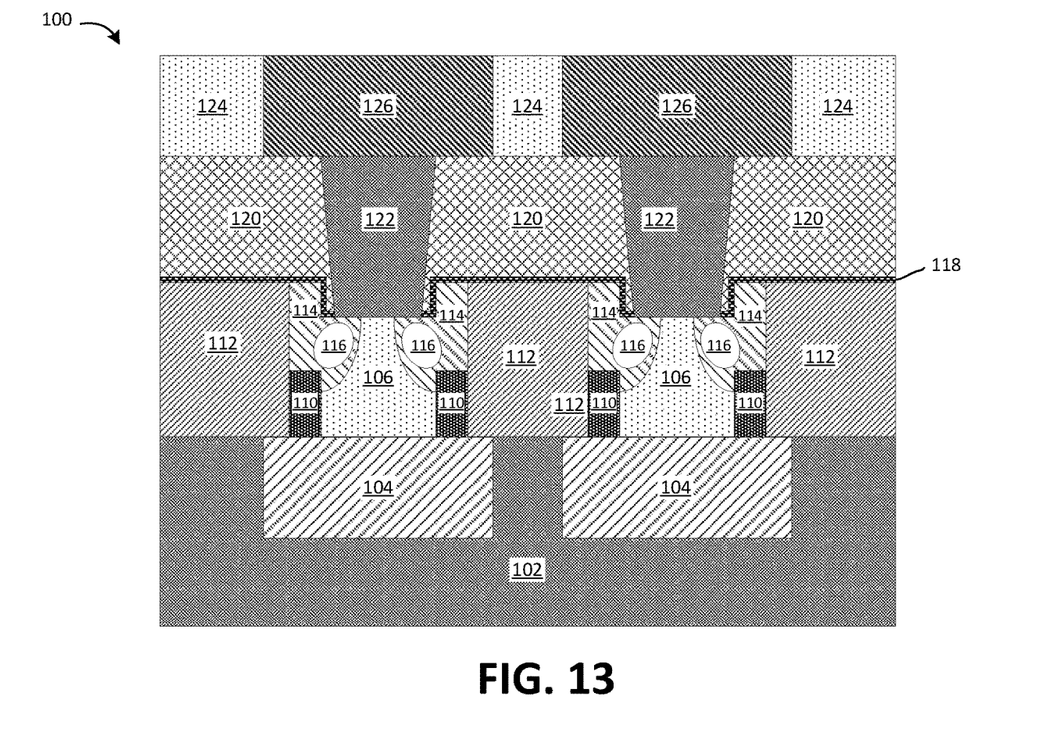
FIG. 13 is a cross-sectional view of the semiconductor device of FIG. 12 after additional fabrication operations, according to embodiments.

Referring now to FIG. 13, this figure is a cross-sectional view of the PCM memory cell 100 of FIG. 12 after additional fabrication operations, according to embodiments. As shown in FIG. 13, a top electrode 126 is formed in contact with the phase change layer 122, and a third ILD layer 124 is formed between the various top electrodes 126.

In certain PCM memory devices, heat produced by the passage of an electric current through a heating element (i.e., the heater 106), generally made of titanium nitride, may be used to either quickly heat and quench the glass (e.g., the GST phase change layer 122 shown in FIG. 12), making it amorphous, or to hold it in its crystallization temperature range for some time, thereby switching it to a crystalline state. In general, phase-change memories (PCMs) are based on the peculiar properties of chalcogenide materials, that is, compounds based on sulfur, selenium, or tellurium, such as GeSe, AsS, SbTe and $In_2Se_3GeAsTe$, or GeSbTe (GST). The latter is the most frequently used material in PCMs such as in the phase change layer 122 shown in FIG. 122. The phase change material can include a Ge—Sb—Te (germanium-antimony-tellurium or "GST", such as $Ge_2Sb_2Te_5$) alloy. Alternatively, other suitable materials for the phase change material include Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, and combinations thereof. In some embodiments, the phase change material can further include nitrogen, carbon, and/or oxygen. In some embodiments, the phase change material can be doped with dielectric materials including but not limited to aluminum oxide ($Al_2O_3$), silicon oxide ($SiO_2$), (Tantalum oxide ($Ta_2O_5$), hafnium oxide ($HfO_2$), zirconium oxide ($ZrO_2$), cerium Oxide ($CeO_2$), silicon nitride (SiN), silicon oxynitride (SiON), etc. The phase change material of the phase change layer 122 can be deposited utilizing physical vapor deposition (PVD), magnetron-assisted sputtering, chemical vapor deposition (CVD), atomic layer deposition (ALD), evaporation, ion beam deposition, electron beam deposition, laser assisted deposition, chemical solution deposition, or any other suitable deposition techniques. After deposition, the phase change material can be planarized, for example, by chemical mechanical polish (CMP).

Figure 14:
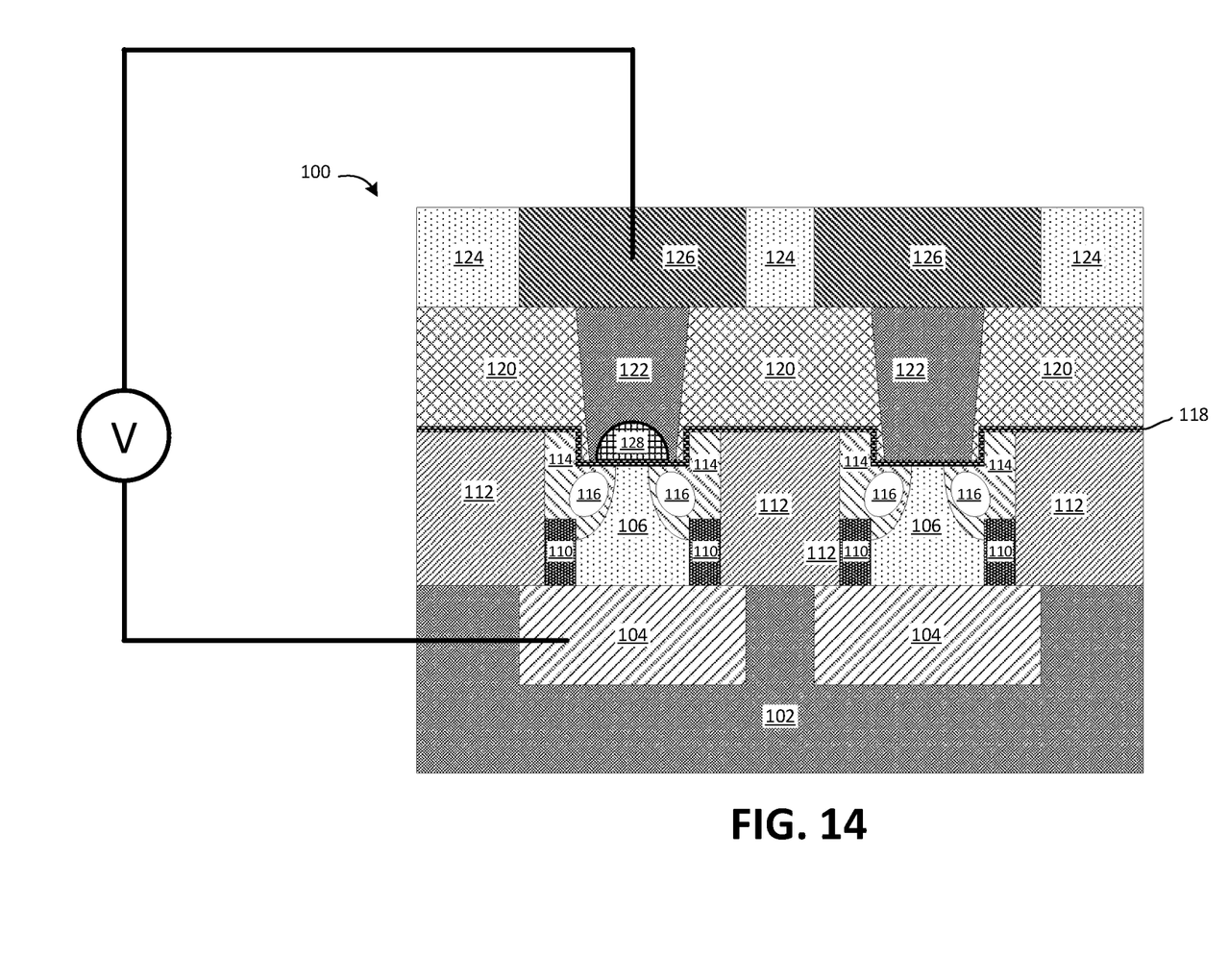
FIG. 14 is a cross-sectional view of a PCM cell semiconductor device showing a set process, according to embodiments.
Figure 15:
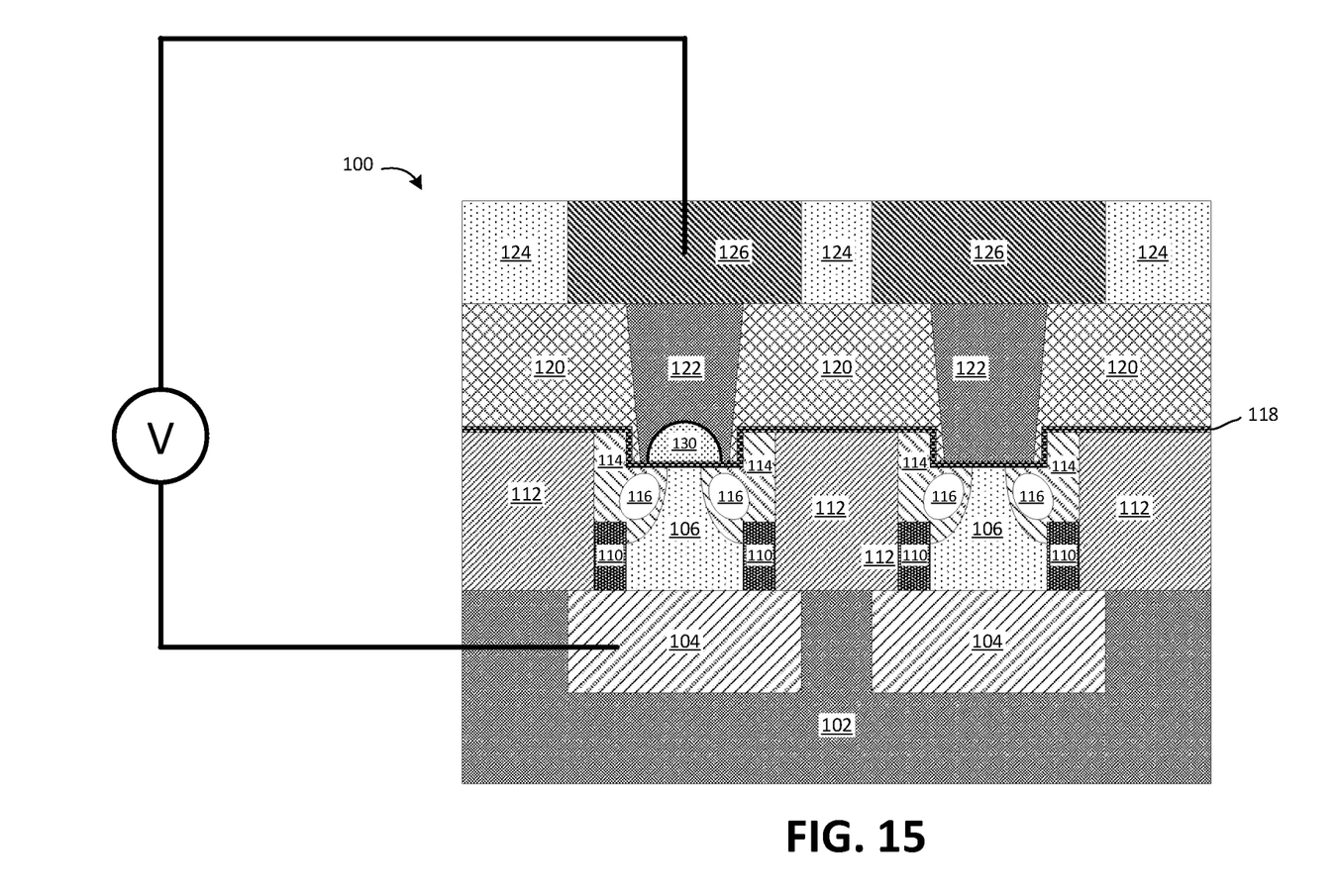
FIG. 15 is a cross-sectional view of a PCM cell semiconductor device showing a reset process, according to embodiments.

Memory switching in these materials is primarily a thermal process, which involves a phase transformation from a crystalline to an amorphous state, and vice versa, under the influence of a heat source (i.e., the TiN layer or the heater 106). When the heating process stops, the material of the phase change layer 122 retains its new state, thus exhibiting memory (the SET operation as also shown in FIG. 14). In practice, this transformation is achieved by passing a constant current through the sample for some time. The transition to an amorphous state 130 as shown in FIG. 15 (the RESET operation) occurs by resistive heating up to the local melting of the phase change layer 124. To switch back to the low resistance crystalline state 128 as shown in FIG. 14 (the SET operation), a lower and longer pulse may be applied. The resistance change between the two states is ~2-3 orders of magnitude, so that reading can easily be accomplished by low-bias nondestructive detection of the cell resistance.

As discussed herein, embodiments in accordance with the present disclosure provide methods and devices for employing a PCM memory cell 100 with airgaps 116 surrounding the nanoscale heating element (or heater 106). Airgaps 116 surrounding the TiN heater 106 prevent thermal dissipation and enable high efficiency heating during the SET/RESET operation, and thus result in a lower SET/RESET current.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a phase change memory (PCM) device, the method comprising:
   forming a bottom electrode on a substrate;
   forming a heater electrode on the bottom electrode, the heater electrode having a tapered portion that becomes narrower in a direction away from the substrate;
   forming an interlayer dielectric (ILD) layer on the tapered portion of the heater electrode, the interlayer layer dielectric including an airgap that at least partially surrounds the tapered portion of the heater electrode;
   forming a phase change layer on the heater electrode; and
   forming a top electrode on the phase change layer.

2. The method according to claim 1, wherein forming the heater electrode includes:
   forming a heater electrode layer;
   forming a dielectric cap on the heater electrode layer;
   forming a sidewall spacer layer on sidewalls of the heater electrode layer and the dielectric cap layer.

3. The method according to claim 2, wherein forming the heater electrode further includes:
   forming the ILD layer around the sidewall spacer layer;
   recessing the sidewall spacer layer to a level that is below an upper surface of the heater electrode layer; and
   performing an isotropic etch on the heater electrode layer to form the heater electrode having the tapered portion.

4. The method according to claim 3, wherein an upper tip portion of the heater electrode has a width that is less than a width of the dielectric cap.

5. The method according to claim 3, further comprising:
   removing the dielectric cap; and
   forming an etch stop layer on the PCM device having openings therein corresponding to a location of the phase change layer, the phase change layer being formed in direct contact with an upper surface of the heater electrode.

6. The method according to claim 3, wherein the sidewall spacer layer is recessed to a level that is above a lower surface of the heater electrode layer.

7. The method according to claim 1, wherein a width of the phase change layer is greater than a width of the tapered portion of the heater electrode.

8. The method according to claim 1, wherein the heater electrode comprises TiN.

9. The method according to claim 1, wherein the tapered portion of the heater electrode has a shape that is selected from the group consisting of conical, pyramidic, and asymptotic.

10. The method according to claim 1, wherein the phase change layer includes at least one selected from the group consisting of GeSe, AsS, SbTe and $In_2Se_3GeAsTe$, or GeSbTe (GST).

11. A phase change memory (PCM) device comprising:
a bottom electrode formed on a substrate;
a heater electrode formed on the bottom electrode, the heater electrode having a tapered portion that becomes narrower in a direction away from the substrate;
an interlayer dielectric (ILD) layer formed on the tapered portion of the heater electrode, the interlayer layer dielectric including an airgap that at least partially surrounds the tapered portion of the heater electrode;
a phase change layer formed on the heater electrode; and
a top electrode formed on the phase change layer.

12. The PCM device according to claim 11, further comprising a sidewall spacer layer formed on sidewalls of the heater electrode.

13. The PCM device according to claim 12, wherein a height of the sidewall spacer layer is less than a height of the heater electrode.

14. The PCM device according to claim 13, wherein an upper tip portion of the heater electrode has a width that is less than a width of the phase change layer.

15. The PCM device according to claim 13, further comprising an etch stop layer formed on the PCM device having openings therein corresponding to a location of the phase change layer, the phase change layer being formed in direct contact with an upper surface of the heater electrode.

16. The PCM device according to claim 11, wherein the heater electrode comprises TiN.

17. The PCM device of claim 11, wherein the tapered portion of the heater electrode has a shape that is selected from the group consisting of conical, pyramidic, and asymptotic.

18. The PCM device of claim 11, wherein the phase change layer includes at least one selected from the group consisting of GeSe, AsS, SbTe and $In_2Se_3GeAsTe$, or GeSbTe (GST).

19. The PCM device of claim 11, wherein the ILD layer comprises SiN.

20. The PCM device of claim 11, wherein the ILD layer includes a first ILD layer comprising SiN and a second ILD layer comprising SiOCN that is formed on the first ILD layer.

* * * * *